United States Patent [19]
Conti

[11] Patent Number: 4,934,956
[45] Date of Patent: Jun. 19, 1990

[54] LOW VOLTAGE LIGHTING STRIP AND METHOD FOR PRODUCING SAME

[75] Inventor: Mario W. Conti, Carlsbad, Calif.

[73] Assignee: CSL Lighting, Inc., Los Angeles, Calif.

[21] Appl. No.: 393,045

[22] Filed: Aug. 8, 1989

Related U.S. Application Data

[63] Continuation-in-part of Ser. No. 225,079, Jul. 27, 1988, abandoned.

[51] Int. Cl.$^5$ .............................................. H01R 13/00
[52] U.S. Cl. .................................................... 439/492
[58] Field of Search ............................ 439/55, 65–67, 439/73, 77, 359, 362, 492, 493, 495

[56] References Cited

U.S. PATENT DOCUMENTS

| | | | |
|---|---|---|---|
| 3,433,888 | 3/1969 | Tally et al. | 439/77 |
| 3,524,921 | 8/1970 | Wolf | 439/492 |
| 3,999,826 | 12/1976 | Yurtin | 439/77 |
| 4,750,881 | 6/1988 | Kikuchi et al. | 439/495 |

Primary Examiner—Joseph H. McGlynn
Attorney, Agent, or Firm—Marvin H. Kleinberg

[57] ABSTRACT

A strip lighting assembly utilizes a film covered pair of copper foil strips to which one or more sockets have been connected. The assembly is produced by placing foil strips on one side of a wide insulating film, placing strips of the same insulating film material over the foil partially covering same, installing lamp sockets from the opposite side through the film and exposed foil and finally, overlapping the film edges to cover the exposed foil. The disclosure covers both the product and the method employed to produce it.

24 Claims, 5 Drawing Sheets

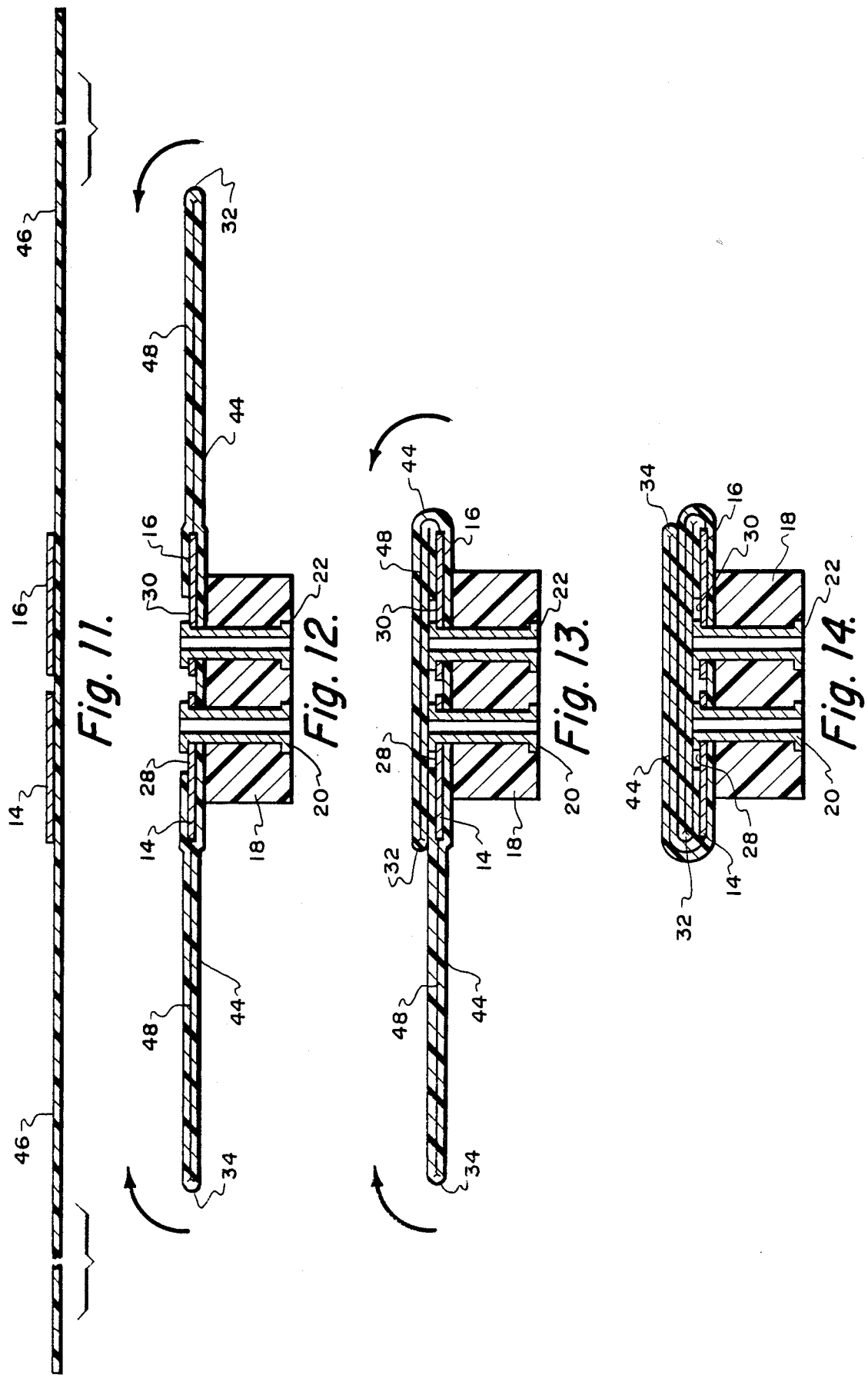

LOW VOLTAGE LIGHTING STRIP AND METHOD FOR PRODUCING SAME

This is a continuation-in-part of copending application Ser. No. 225,079, filed on July 27, 1988, now abandoned.

BACKGROUND OF THE INVENTION

The present invention is concerned with flexible conductive strips and more particularly, conductive lighting strips which can be used for display cases, shelves and other areas where an array of lighting elements may follow irregular contours or borders.

Typically, display case shelving has been illuminated by affixing a lighting fixture such as a fluorescent bulb or a line of incandescent bulbs within a reflective shield to the front underside of a top shelf. Such lighting sources, however, do not provide optimum illumination. In fact, they tend to distort colors as compared to their appearance in natural sunlight, and, when incandescent lamps are used, they tend to be wasteful of power. Because color is an important feature of most items placed in a display case, it is preferable that more natural illumination be provided.

Moreover, most available lighting fixtures are relatively bulky or are of the fluorescent type which do not provide the proper lighting for the display of most objects. A small, flexible, low voltage illumination strip would be most desirable for such diplay case applications.

Strip lighting which follows the contours of an architectural feature, or which outlines and illuminates special features of a structure, is typically created using conventional wiring which includes a plurality of lamp sockets spaced at desired intervals. "Christmas tree" lighting is an example of this variety. Such strip lighting is typically wired in series and if one bulb fails the whole strip fails through an open circuit. A painstaking bulb by bulb inspection is then required to find the failed unit or units. Parallel wiring, on the other hand, would be preferable, since burnt out bulbs can be quickly located and replaced. However, heavier gauge wiring is necessary because the current that must be supplied in a parallel circuit is equal to the product of the current in one lamp times the number of lamps.

The strip lighting employed in the prior art is generally unattractive and not easily fastened in place. Further, conventional, small gauge wiring necessary for an inconspicuous installation can have relatively high resistivity over long runs which adversely affects the brightness that is available. What is required, therefore, is strip lighting that can be both flexible and of low resistivity. Further, it should lend itself to the parallel wiring of the component lighting elements with the required high conductivity and which can be easily concealed or obscured from view.

SUMMARY OF THE INVENTION

An object of the present invention is to provide low profile strip lighting having flexibility and low resistivity combined with an excellent light spectrum.

In general the present invention is embodied in an improved display lighting apparatus comprised of an electrically conductive strip that is adapted to be easily fastened to any surface and has a pair of conductors. Each conductor of the strip has substantial current capacity and is adapted to be connected to a corresponding power terminal of a power source, which may be the output terminals of a low voltage power supply transformer.

The electrically conductive strip includes two generally parallel lengths of conductive foil each approximately $\frac{1}{4}'$ to $\frac{3}{4}'$ wide in the preferred embodiments covered by an insulative film except for a narrow strip near the interior longitudinal edges of the two lengths of foil. Lamp socket members are held by a spacer to the strip and are electrically connected across the two foil strips. Light fixtures or lamps may then be plugged into these sockets to provide a strip of illumination, particularly effective with display case shelving.

By adapting the flexible strip to receive other types of socket members, the present invention can be adapted to provide a power source for electrical accessories other than lights.

BRIEF DESCRIPTION OF THE DRAWINGS

Further advantages and features of the present invention will be more fully apparent to those skilled in the art to which the invention pertains from the ensuing detailed description thereof, regarded in conjunction with the accompanying drawings wherein like reference numerals refer to like parts throughout and in which:

FIG. 11 is a cross-sectional view of yet another embodiment of a wider laminate strip with conductive strips placed thereon;

FIG. 12 is a view of the strip of FIG. 11 having a socket thereon and showing a first and second fold;

FIG. 13 is a view of the strip of FIG. 12 showing a third fold;

FIG. 14 is a view of the strip of FIG. 13 showing a fourth fold;

DESCRIPTION OF THE PREFERRED EMBODIMENTS

Figure 1:
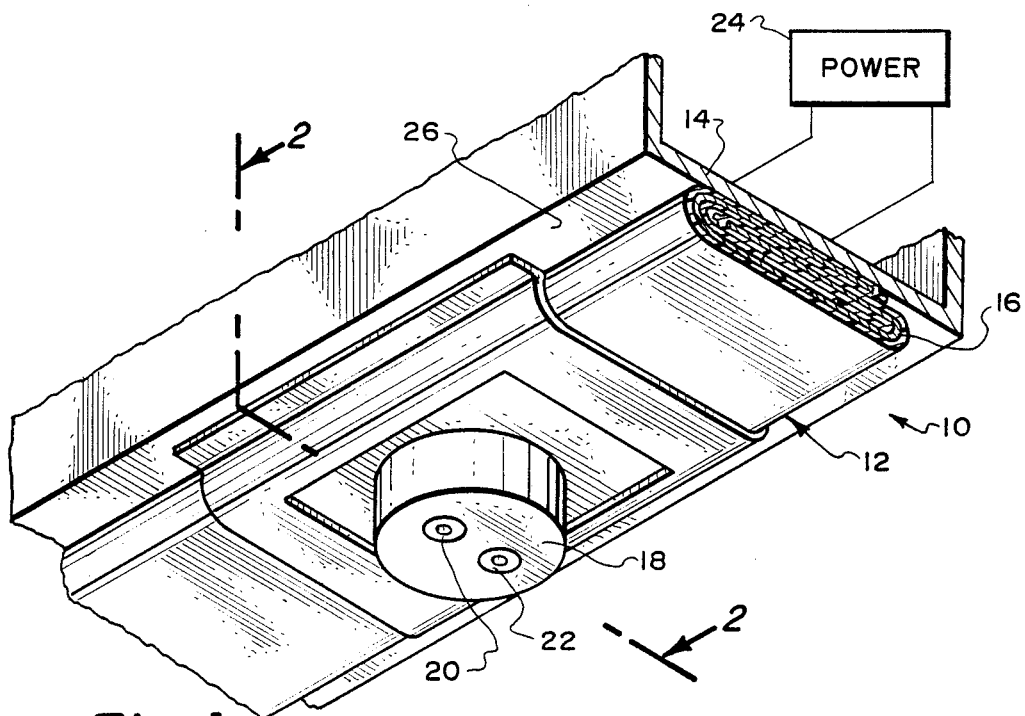
FIG. 1 is a bottom perspective view of a length of strip lighting with a lamp socket assembly attached thereto.
Figure 2:
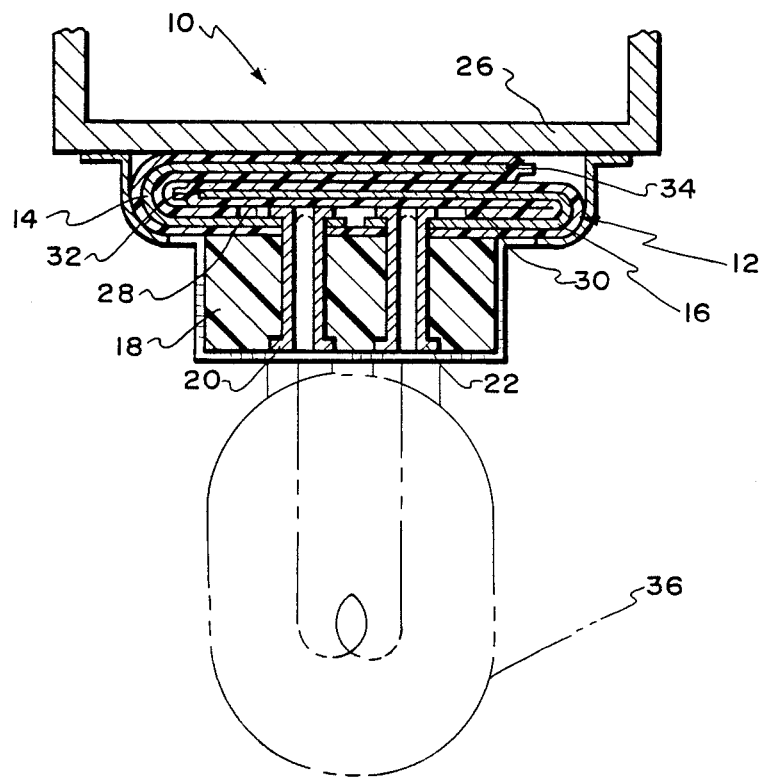
FIG. 2 is an enlarged cross-sectional view taken along line 2—2 of FIG. 1, in the direction of the appended arrows with a light bulb shown in dotted lines.

The details of the construction of strip lighting 10 are shown in FIGS. 1 and 2. FIG. 1 shows the fully insulated strip lighting assembly 10 mounted for illumination purposes. FIG. 2 shows an enlarged cross-sectional view of the fully assembled strip lighting assembly. From FIG. 1, it can be seen that a typical strip 10 includes an insulating laminate 12, which surrounds a conductive pair 14, 16 to which a socket element 18 has been attached. A pair of pin receptacles 20, 22 is in electrical contact with the conductor pair 14, 16 and is adapted to connect to a source of power 24. As seen, the strip 10 is mounted on a substrate 26, which may be a structural element whose contours can be followed.

In the cross-sectional view of FIG. 2, the strip 10 is shown enlarged so that the various components and their interrelationships can be visualized. In FIG. 2, the length of laminate strip 12 has already been folded over as will be described below. It is at the exposed portions 28 and 30 of the two foil strips 14 and 16 that the electric contact is made with pin receptacle sockets 20 and 22. Socket 20 is soldered, or otherwise electrically connected, to the exposed strip 28 and socket 22 is electrically connected to exposed strip 30. After electrically connecting the exposed strip 28 of foil portion 14 and exposed strip 30 of foil portion 16 to the sockets 20 and 22, respectively, the laminate strip 12 is then folded cover. Firstly, edge 32 is folded over the base of the sockets 20 and 22 and then, edge 34 is folded over edge 32 also over both of the sockets.

This provides the fully insulated assembly, as shown in FIG. 1, except for the two exposed sockets 20, 22 into which a bulb, such as bulb 36, may be inserted. Although an exposed bulb 36 is shown in FIG. 2, other lighting fixtures may be alternatively used. For instance, a bulb and reflector assembly, (not shown) might be used. In this manner, a reflector may be aimed so that light emitted by the bulb is directed toward a desired object. Thus, the same strip may contain exposed bulbs, such as bulb 36, or bulb and reflector assemblies.

Thus, an exceptionally flexible strip lighting assembly can easily be provided with illumination appropriate to articles on display shelves. It is not necessary that a bulb be plugged in each of the sockets in the event less light is desirable. The lengths of strip lighting 10 may be mounted under the front edge of the shelves of a display case. Alternatively, it may be provided under the side edges, the back edge or along the middle of the underside of any of the shelves. Thus, the concept is, of course, not limited to lighting along the front edge of a display case. Nor is the concept limited to display case lighting. The strip lighting assembly can be used wherever low voltage natural illumination is sought. It can be used to illuminate foot paths or along theatre aisles at floor level. It can also be used to display items in showcases, china cabinets and breakfronts.

The flexible strip lighting assembly can be folded in such a fashion as to provide variant spacing between the lamps. By folding and overlapping the strip, the distances between lamps can be changed according to various lighting and architectural requirements.

The flexible strip assembly can also be easily adapted to provide a power source for various electrical accessories other than lights. Other types of socket members which are adapted to provide power to electrical accessories can be affixed to the flexible strip, providing a flexible, parallel power source.

Figure 3:
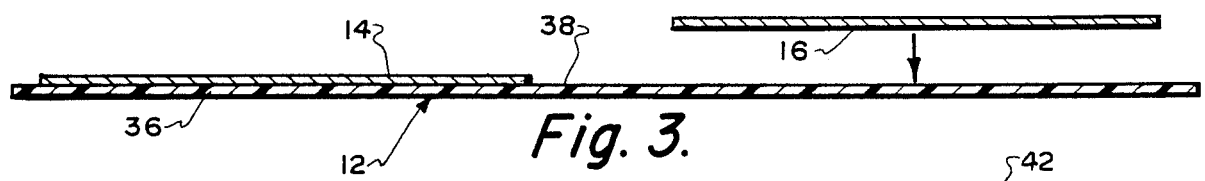
FIG. 3 is a cross-sectional view of a length of unfolded strip lighting showing the placement of conductive material upon the laminar surface in a first embodiment.

The present invention also includes a method of fabricating the flexible electrically conductive strip means, as shown in FIGS. 3-7. As shown in FIG. 3, two conductive strips 14 and 16 are placed on a strip of insulative material 36 in generally parallel relationship to the longitudinal axis. Strips 14 and 16 are aligned on insulative material 36 in a parallel fashion but are separated from one another by a gap 38 of about one-sixteenth of an inch.

Figure 4:
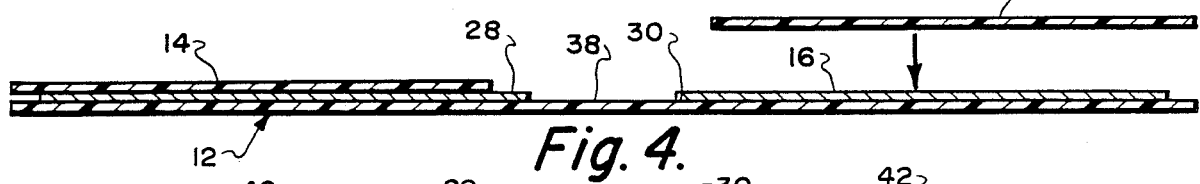
FIG. 4 is a cross-sectional view of a length of unfolded strip lighting showing the placement of insulative material over the conductive material.

As shown in FIG. 4, a first insulator strip 40 is then placed over the foil strip 14 and a second insulator strip 42 is placed over the foil strip 16. The first and second insulators 40 and 42 cover the foil strips 14 and 16 except for the two narrow, exposed portions 28 and 30.

Figure 5:
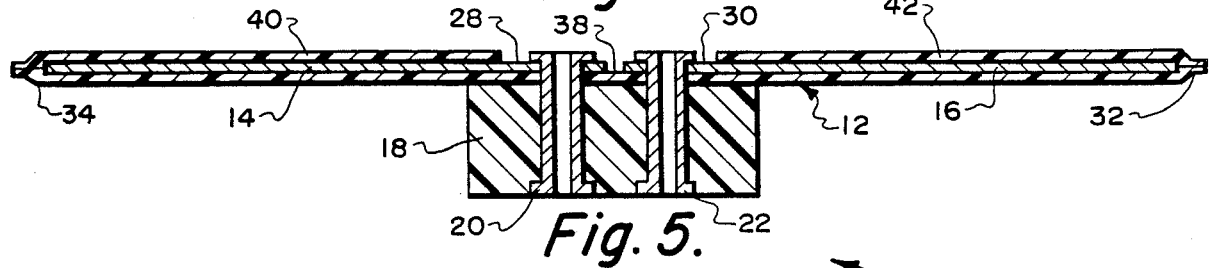
FIG. 5 is a cross-sectional view of the strip lighting of the present invention in an unfolded configuration having a socket thereon.

As seen in FIG. 5, the first and second insulator strips 40 and 42 are laminated to strip 12 at the ends 32 and 34. A socket 20 of socket element 18 is soldered, or otherwise electrically connected, to the exposed conductive strip 28 and a socket 22 of socket element 18 is electrically connected to the exposed conductive strip 30. After the electrical connections are made, the laminated strip 12 is then folded over.

Figure 6:
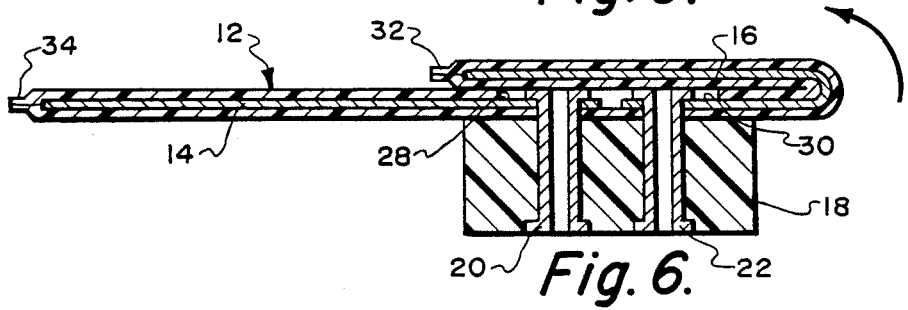
FIG. 6 is a view of the strip of FIG. 5 showing a first fold.
Figure 7:
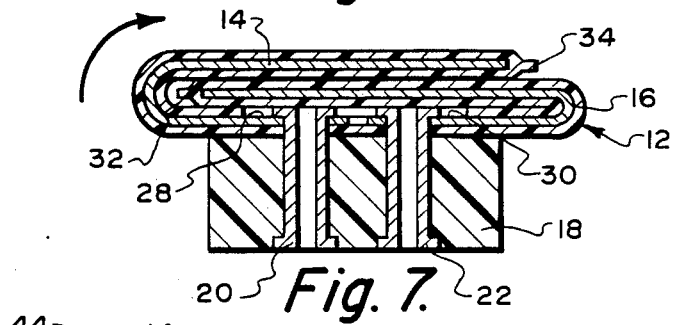
FIG. 7 is a view of the strip of FIG. 6 showing a second fold.

Turning next to FIG. 6, edge 32 is folded over the base of the sockets 20 and 22 covering the exposed portions of the conductive strips 28 and 30. Then, as seen in FIG. 7, edge 34 is folded over edge 32 also covering both of the sockets 20 and 22 and the previously exposed portions 28 and 30. The resulting fully insulated assembly of FIG. 7, also seen in FIG. 2, shows the bulb 36 inserted into the two exposed sockets 20 and 22.

Figure 8:
FIG. 8 is cross-sectional view of an alternate embodiment of a laminate strip with conductive strips placed thereon.
Figure 9:
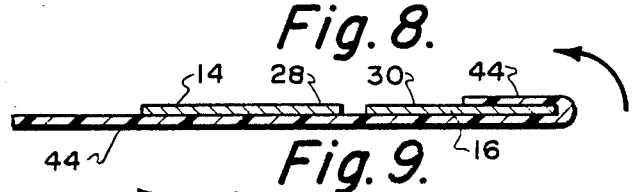
FIG. 9 is a view of the strip of FIG. 8 showing a first fold.
Figure 10:
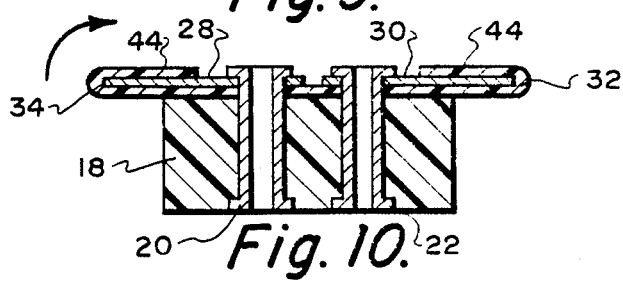
FIG. 10 is a view of the strip of FIG. 9 having a socket thereon and showing a second fold.

A first alternatative embodiment of a method of fabricating the present invention is shown in FIGS. 8-10. The first alternative embodiment involves the use of a wider insulative strip 44 upon which the conductive strips 14 and 16 are placed, as seen in FIG. 8. The longitudinal edges of the insulative strip 44 are then folded over conductive strips 14 and 16 respectively.

FIG. 9 shows the fold of the first edge of insulative strip 44, allowing conductive strip 28 to remain exposed. FIG. 10 shows the fold of the opposite edge of insulative strip 44 allowing conductive strip 30 to remain exposed. Again sockets 20 and 22 are electrically connected to the exposed strips 28 and 30. As in FIGS. 6 and 7, the edges 32 and 34 of strip 12 are then folded over the exposed portions 28 and 30 and the sockets 20 and 22 to provide the fully insulated assembly of FIG. 2.

In yet another alternative embodiment of the product and process, as shown in FIGS. 11-14, a single flexible insulative substrate 46 may be employed that is substantially wider than the pair of ribbon conductors 14 and 16. In this embodiment, as seen in FIG. 12, a first fold leaves a substantial width of double thickness insulative film 48 adjacent to the partially covered conductive ribbon 14. A second fold from the opposite edge partially covers the other conductive ribbon 16.

As before, apertures are made through the exposed strips 28, 30 of the conductive ribbons 14, 16 and the underlying insulative material 46, through which socket pins can be electrically connected to the ribbon cable. The socket elements 18 are placed below the insulative substrate and the contacting pins come "up" through the conductive ribbons. The pins are placed in good electrical connection either by soldering or swaging into place.

Finally, the double thickness of insulative material 48 extending beyond both ribbon cables 14 and 16 is folded to the center in overlapping folds, substantially in thirds so that the edge 32 from the first fold is the fold is the fold line for the overlapping fold from the other side. The folded portions may be kept in place either by an adhesive or by a heat seal or bond.

The present embodiments of this invention are thus to be considered in all respects as illustrative and not restrictive; the scope of invention being indicated by the appended claims rather than the foregoing description. All changes which come within the meaning and range of equivalency of the claims are intended to be embraced therein.

In yet a further embodiment, illustrated in FIGS. 15-20, insulation is placed between the conductive strips to minimize the risk of arcing and to preclude the possibility that the conductive strips might come into contact with each other.

Figure 15:
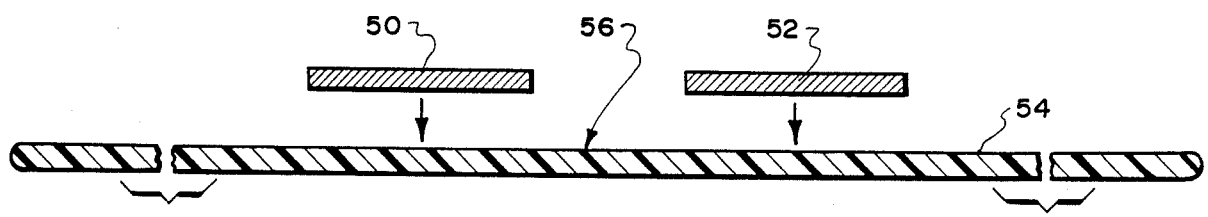
FIG. 15 is a cross-sectional view of a length of unfolded strip lighting material showing the placement of conductive material upon insulative film in yet another embodiment.
Figure 16:
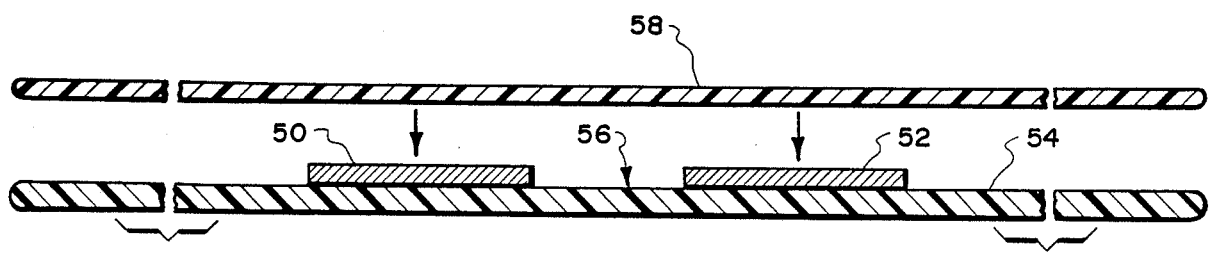
FIG. 16 is a cross-sectional view of the strip lighting showing the placement of insulative material upon the conductive material.
Figure 17:
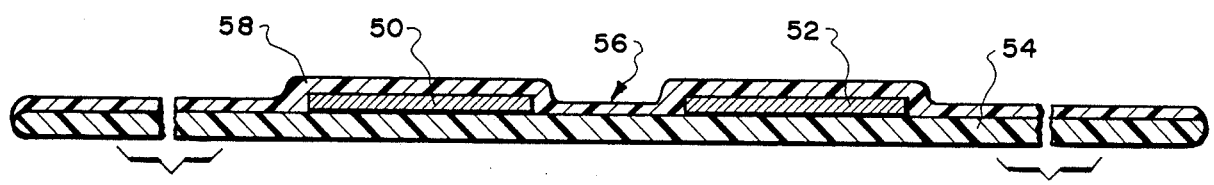
FIG. 17 is a cross-sectional view of the strip lighting of FIG. 16 showing the use of a second insulative material to seal the gap between the conductive strips.

In FIG. 15, as in other embodiments, wide conductive strips 50 and 52 are placed longitudinally, in a nearly parallel fashion, along an insulative film 54 as in the earlier embodiments. The conductive strips 50 and 52 are placed upon the insulative film 54 and are separated from one another by a gap 56 of about one-sixteenth of an inch. In this embodiment, the strips 50, 52 are each preferably wider than ½" and run to ¾" in width. Typically, the insulative film 54 is a three mil, heat sensitive, opaque polyester film with a heat sensitive adhesive, although any flexible material with insulative properties will do. The conductive strips 50 and 52 are adhered to the first insulative film 54 and, as illustrated in FIG. 16, a second polyester film 58, substantially the same width and length of the insulative film 54, is then placed on top of the conductive strips 50 and 52. As illustrated in FIG. 17, The second insulative film 58 is heat sealed to the first film 54 and also seals the gap 56 between conductive strips 50 and 52.

Figure 18:
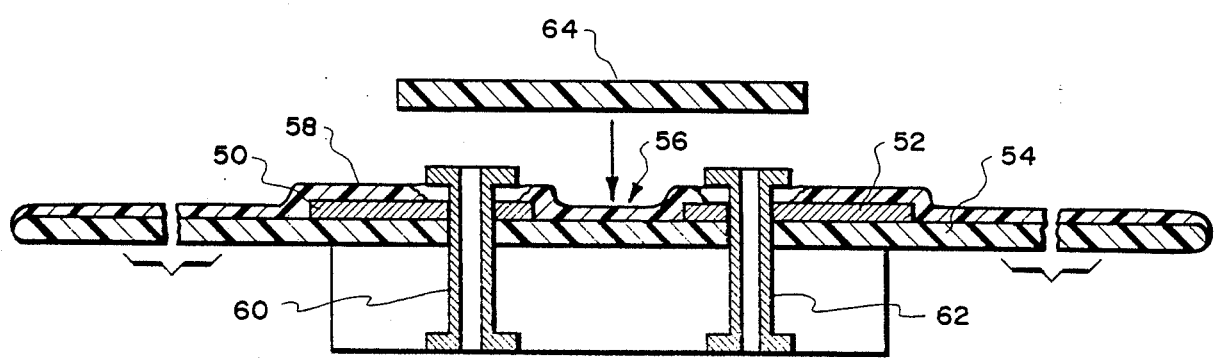
FIG. 18 is a cross-sectional view of the strip lighting of FIG. 17 having a socket thereon and showing the placement of a third insulative material upon the conductive strips.

As illustrated in FIG. 18, holes are punched through film layers 54 and 58, and through exposing conductive strips 50 and 52 near the adjacent edges so that electrical sockets 60 and 62 can be connected to conductive strips 50 and 52 by soldering. The soldering process incidentally burns away some of the second insulative film 58.

Figure 19:
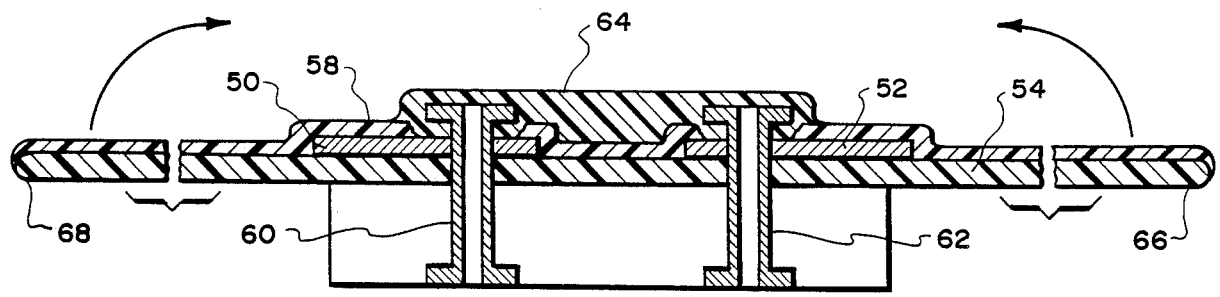
FIG. 19 is a cross-sectional view of the strip lighting of FIG. 18 showing the completed strip assembly prior to folding.

A third insulative film strip 64, which may be composed of pressure sensitive tape, is used to cover any of the exposed portions of conductive strips 50 and 52 and the soldered connections and to ensure that no conductive elements are exposed, as illustrated by FIG. 19.

Figure 20:
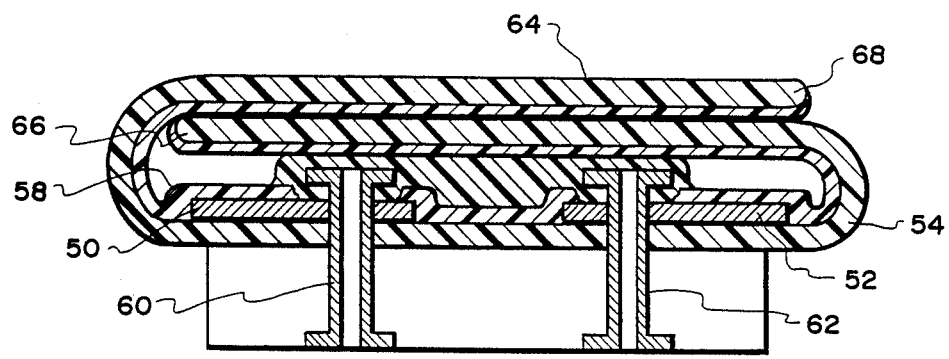
FIG. 20 is a cross-sectional view of the strip lighting of FIG. 19 with the longitudinal edges folded one over the other.

FIG. 20 illustrates the finished flexible strip after the first longitudinal edge 66 and the second longitudinal edge 68 have been folded over each other. The folded edges 66 and 68 minimize the area and volume of the strip while maintaining the high current available with the parallel conductive strips of ½" or greater width.

What is claimed is:

1. A flexible electrically conductive strip means comprising:
    (a) a pair of conductors adapted to be folded lengthwise to reduce their area without impairing their current carrying capacity;
    (b) an insulative film surrounding said pair of conductors;
    (c) means for connecting said conductors to a source of electrical current;
    (d) at least a pair of socket elements adapted to be electrically connected to said conductors wherein the spacing of said socket elements is modifiable by substantially transversely folding the strip means; and
    (e) means for electrically connecting each of said socket elements to each said conductor.

2. The flexible electrically conductive strip means of claim 1 wherein said socket elements are adapted to receive a power plug.

3. The flexible electrically conductive strip means of claim 1 wherein said conductors are wide flat strips.

4. The flexible electrically conductive strip means of claim 1 further comprising a second insulative film adapted to further seal the spacing between said first and said second lengths of conductive foil.

5. The flexible electrically conductive strip means of claim 1 wherein said pair of socket elements are adapted to supply electrical power to at least one lamp connector.

6. The flexible electrically conductive strip means of claim 5 wherein there are at least two socket elements adapted to receive lamps spaced at predetermined intervals.

7. A flexible electrically conductive strip means comprising:
    (a) a first length of conductive foil having an upper surface and a lower surface adapted to be folded lengthwise to reduce its area without impairing its current carrying capacity;
    (b) a second length of conductive foil spaced from and generally parallel to said first length of conductive foil said second length of conductive foil also having an upper surface and lower surface and adapted to be folded lengthwise to reduce its area without impairing its current carrying capacity;
    (c) an insulative film surrounding said first and second lengths of conductive foil, adapted to be folded lengthwise to reduce its area without impairing its current carrying capacity;
    (d) a first conductive socket element adapted to be electrically connected to said first length of conductive foil;
    (e) a second conductive socket element adapted to be electrically connected to said second length of conductive foil, wherein the spacing between said first and second conductive socket elements is modifiable by substantially transversely folding the strip means; and
    (f) means for electrically connecting said conductive socket elements through said insulative film to portions of said first and second lengths of conductive foil.

8. The flexible electrically conductive strip means of claim 7 wherein the socket elements are adapted to supply electrical power to at least one lamp inserted therein.

9. The flexible electrically conductive strip means of claim 7 wherein there are at least two lamps inserted in conductive socket elements spaced at predetermined intervals.

10. The flexible electrically conductive strip means of claim 7 wherein said socket elements are adapted to receive a power plug.

11. The flexible electrically conductive strip means of claim 7 wherein said conductive foils are wide flat strips.

12. The flexible electrically conductive strip means of claim 7 further comprising a second insulative film adapted to further seal the spacing between said first and said second lengths of conductive foil.

13. The flexible electrically conductive strip means of claim 7 wherein said conductive foils each have a width greater than ½".

14. A method for preparing a flexible electrically conductive strip means which comprises;
   (a) applying first and second generally parallel conductive ribbons to an insulating film substrate;
   (b) shielding and isolating said conductive ribbons by insulative film; and
   (c) electrically connecting conductive socket elements, to said first and second conductive ribbons, at predetermined intervals, wherein the spacing of said socket elements is modifiable by transversely folding said conductive strip means.

15. The method of claim 14 wherein the step of shielding said conductive ribbons includes the steps of:
   (a) selecting an insulating substrate sufficiently wide to cover said conductive ribbons; and
   (b) folding one side of said insulating substrate lengthwise forming a first fold covering the exposed surfaces of said conductive ribbons; and
   (c) folding the other side of said insulating substrate lengthwise to cover said first fold.

16. The method of claim 14 including an additional step of electrically connecting at least one socket element to said conductive ribbons.

17. The method of claim 16 including an additional step of inserting a lamp into each said socket elements.

18. The method of claim 16 further including an additional step of connecting a socket element to at least one power plug.

19. The method of claim 16 wherein said parallel conductive ribbons are each greater than ½" in width.

20. The method of claim 16 further including the steps of folding each side of said insulating substrate and ribbon contained therein lengthwise, one overlapping the other, to reduce the area of the conductive strip means.

21. The flexible electrically conductive strip means of claim 1 wherein said insulative film covers all but a narrow width of said conductive material.

22. The flexible electrically conductive strip means of claim 20 wherein said insulative film is adapted to be folded lengthwise to cover the exposed portions of said conductive material.

23. The flexible electrically conductive strip means of claim 7 wherein said insulative film covers all but a narrow width of said conductive material.

24. The flexible electrically conductive strip means of claim 24 wherein said insulative film is adapted to be folded lengthwise to cover the exposed portions of said conductive material.

* * * * *